(12) United States Patent
Ahn et al.

(10) Patent No.: US 6,653,725 B2
(45) Date of Patent: Nov. 25, 2003

(54) CHIP PACKAGE AND METHOD OF MANUFACTURING THE SAME

(75) Inventors: Moon Bong Ahn, Kyungki-do (KR); Chan Wang Park, Kyungki-do (KR); Yong Chil Choi, Kyungki-do (KR)

(73) Assignee: Samsung Electro-Mechanics Co., Ltd., Kyungki-do (KR)

(*) Notice: Subject to any disclaimer, the term of this patent is extended or adjusted under 35 U.S.C. 154(b) by 0 days.

(21) Appl. No.: 10/321,427

(22) Filed: Dec. 18, 2002

(65) Prior Publication Data

US 2003/0122230 A1 Jul. 3, 2003

(30) Foreign Application Priority Data

Dec. 27, 2001 (KR) ........................................ 2001-86347

(51) Int. Cl.[7] .............................................. H01L 23/48
(52) U.S. Cl. ........................................ 257/690; 257/693
(58) Field of Search ................................ 257/678, 690, 257/692, 698, 693

(56) References Cited

U.S. PATENT DOCUMENTS

| | | | | |
|---|---|---|---|---|
| 3,708,722 A | * | 1/1973 | Wiles | .......................... 317/234 |
| 4,005,457 A | * | 1/1977 | Hill et al. | ...................... 357/72 |
| 4,574,297 A | * | 3/1986 | Ooi | |

* cited by examiner

Primary Examiner—Roy Potter
(74) Attorney, Agent, or Firm—Lowe Hauptman Gilman & Berner LLP

(57) ABSTRACT

A chip package includes a chip having a first surface provided with a first terminal and a second surface provided with at least one second terminal, the second surface being opposite to the first surface, a first substrate arranged on the first surface of the chip and having a first conductive via hole connected to the first terminal, a second substrate arranged on the second surface of the chip and having at least one second conductive via hole connected to the second terminal, and a resin molding part formed around the chip between the first substrate and the second substrate. And the present invention provides a chip package assembly including the chip package. Further, a method of manufacturing the chip package and an assembly including the chip package are provided. The chip package does not use a bonding wire and additional conductive lands, thereby reducing the size of the package and simplifying the manufacturing process.

18 Claims, 7 Drawing Sheets

CHIP PACKAGE AND METHOD OF MANUFACTURING THE SAME

BACKGROUND OF THE INVENTION

1. Field of the Invention

The present invention relates to the field of semiconductor manufacturing, and more particularly to a chip package, which is miniaturized and more simply manufactured by attaching a substrate provided with conductive via holes to both surfaces of a chip, and a method of manufacturing the chip package.

2. Description of the Related Art

As well known to those skilled in the art, semiconductor elements such as diodes or transistors are packaged and these packaged elements are then mounted on a printed circuit board. Structurally, this package easily connects terminals of the semiconductor chip to corresponding signal patterns of the printed circuit board and serves to protect the semiconductor chip from external stresses, thereby improving reliability of the package.

In order to satisfy recent trends of miniaturization of semiconductor products, the semiconductor chip packages also have been miniaturized. Therefore, a chip scale package has been introduced. FIG. 1 is a schematic cross-sectional view of a conventional chip scale package. The structure of the chip scale package 10 of FIG. 1 employs a ceramic substrate 1 and is applied to a diode with two terminals.

With reference to FIG. 1, two via holes, i.e., a first via hole 2a and a second via hole 2b, are formed on the ceramic substrate 1. The first and the second via holes 2a, 2b are filled with a conductive material so as to electrically connect the upper and the lower surfaces of the first and the second via holes 2a, 2b. Then, a first and a second upper conductive lands 3a, 3b are formed on the upper surfaces of the first and the second via holes 2a, 2b, respectively. A first and a second lower conductive lands 4a, 4b are formed on the lower surfaces of the first and the second via holes 2a, 2b, respectively. The second upper conductive land 3b is directly connected to a terminal formed on the lower surface of the diode 5, i.e., a mounting surface of the diode 5 on a printed circuit board, and the first upper conductive land 3a is connected to the other terminal formed on the upper surface of the diode 5 by a wire 7. A molding part 9 using a conventional resin is formed on the upper surface of the ceramic substrate 1 including the diode 5 in order to protect the diode 5 from the external stresses. Thereby, the manufacture of the package 10 is completed.

FIG. 2 is a schematic perspective view of a conventional chip package array.

As shown in FIG. 2, the manufactured chip package 10 is mounted on the printed circuit board 20 by a reflow soldering. The diode package 10 is electrically and mechanically connected to the printed circuit board 20 by arranging the upper conductive lands 3a, 3b and the lower conductive lands 4a, 4b of the package 10 on the corresponding signal patterns of the printed circuit board 20 and by then connecting the upper conductive lands 3a, 3b and the lower conductive lands 4a, 4b to the signal patterns with a solder 15.

As shown in FIGS. 1 and 2, since the diode usually has terminals on its two opposite surfaces, these terminals should be interconnected by wires. However, these wires require a rather large space on the upper surface of the chip, thereby increasing the overall height of the package. Further, since two or three via holes, corresponding to the number of the terminals of the chip, are formed on the ceramic substrate, an area as large as the total diameters of the via holes is further required. Moreover, in order not to connect the conductive lands formed on the upper and the lower surfaces of the via holes to each other, the conductive lands are spaced from each other by a designated interval. Therefore, the size of the substrate imposes a limit in miniaturizing the package.

Accordingly, a packaging technique, which can minimize the size of the package and simplify its manufacturing process, has been demanded.

SUMMARY OF THE INVENTION

Therefore, the present invention has been made in view of the above problems, and it is an object of the present invention to provide a stable chip package, which is miniaturized, more simply manufactured and improves its reliability by attaching a substrate provided with conductive via holes to two opposite surfaces of a chip and by forming a resin molding part in a space between two substrates.

It is another object of the present invention to provide a chip package assembly, which is mounted on a printed circuit board by a innovative method according to the structure of the chip package.

It is a yet another object of the present invention to provide a method of manufacturing the chip package.

In accordance with one aspect of the present invention, the above and other objects can be accomplished by the provision of a chip package comprising a chip having a first surface provided with a first terminal and a second surface provided with at least one second terminal, the second surface being opposite to the first surface, a first substrate arranged on the first surface of the chip and having a first conductive via hole connected to the first terminal, and a second substrate arranged on the second surface of the chip and having at least one second conductive via hole connected to the second terminal.

In preferable embodiment according to the present invention, the chip package further comprises a resin molding part formed around the chip between the first substrate and the second substrate.

Also, the first substrate may have the same size and shape as those of the second substrate, and the resin molding part may have the same size and shape as those of the first substrate and the second substrate, thereby further miniaturizing the package. Further, the chip package may be hexahedral-shaped.

Further, preferably, the first and the second substrates may be made of a printed circuit board.

Moreover, preferably, each of the first and second conductive via holes of the first and second substrates may be formed on at least one side of each substrate in an approximately semicircular shape, or on at least one corner of each substrate in an approximately quarter-circular shape.

Preferably, the chip package may be applied to a diode element with two terminals or to a transistor element with three terminals. In case of the transistor element, the second substrate attached to the second surface of the transistor comprises two second conductive via holes to correspond to two terminals.

In accordance with another aspect of the present invention, there is provided a chip package assembly comprising a chip package and a printed circuit board. The chip package comprises a chip having a first surface provided with a first terminal and a second surface provided with at least one second terminal, the second surface being opposite to the first surface, a first substrate arranged on the first surface of the chip and having a first conductive via hole connected to the first terminal, and a second substrate arranged on the second surface of the chip and having at least one second conductive via hole connected to the second terminal. The printed circuit board comprises a plurality of signal patterns formed on the upper surface of the printed circuit board and connected to the terminals of the chip package, and a plurality of conductors for connecting the first and second conductive via holes to the signal patterns. Herein, the chip package is vertically mounted on the upper surface of the printed circuit board so that the outer surfaces of the first and second substrates become side surfaces. Preferably, the conductor may be solder.

In accordance with yet another aspect of the present invention, there is provided a method of manufacturing a plurality of chip packages. The method comprises the steps of preparing a plurality of chips, each having a first surface with a plurality of terminals and a second surface provided with a plurality of terminals, the second surface being opposite to the first surface, preparing a first substrate and a second substrate, each having a plurality of via holes, attaching the second surfaces of the chips to the second substrate so that the terminals of the second surfaces of the chips are connected to the conductive via holes of the second substrate, attaching the first surfaces of the chips to the first substrate so that the terminals of the first surfaces of the chips are connected to the conductive via holes of the first substrate, and sawing the chip assembly into a plurality of unit chip packages.

Preferably, the step of attaching the first and the second surfaces of the chips to the first and the second substrate may comprise the sub-steps of coating the upper surfaces of the conductive via holes of the first and second substrate or the upper surfaces of chips with a conductive adhesive, and compressing the chips on the upper surface of the second substrate or the first substrate on the first surfaces of the chips.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
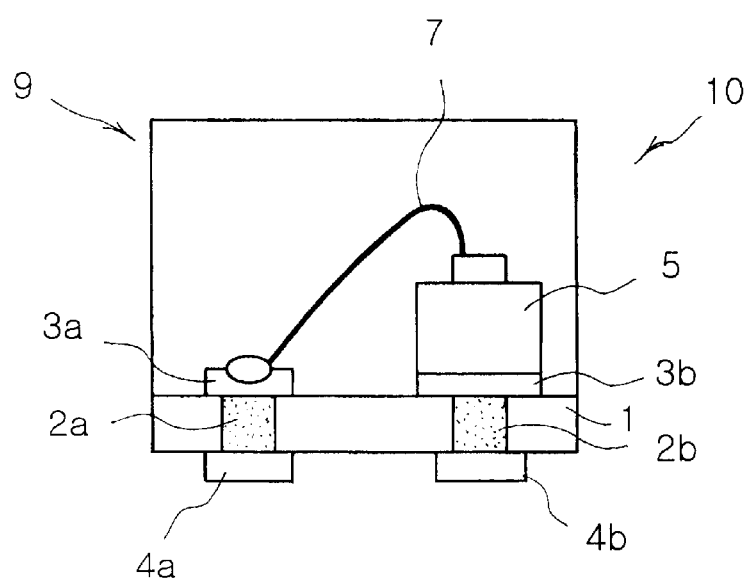
FIG. 1 is a cross-sectional view of a conventional chip package.
Figure 2:
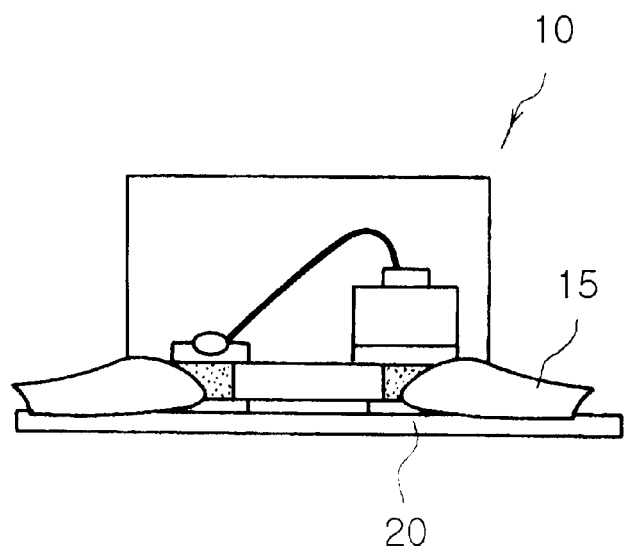
FIG. 2 is a schematic perspective view of a conventional chip package array.
Figure 3:
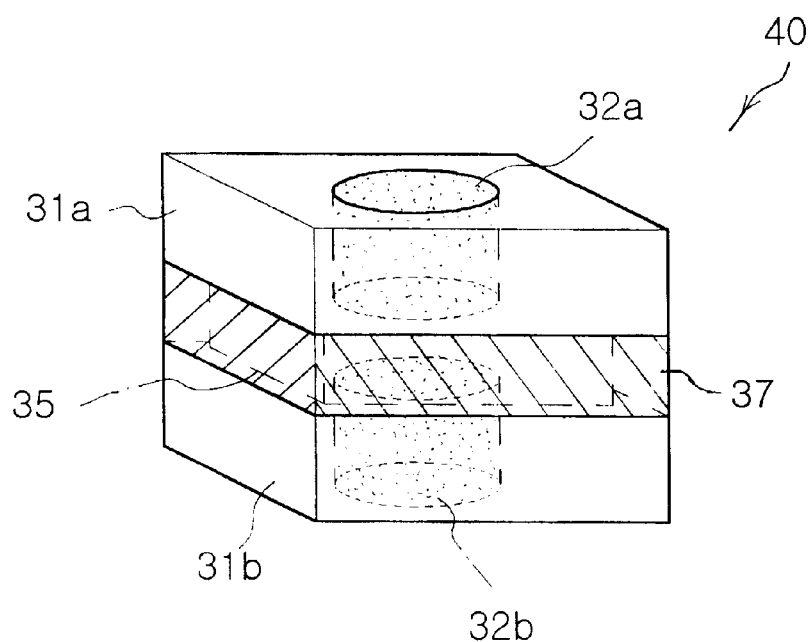
FIG. 3 is a perspective view of a chip package in accordance with an embodiment of the present invention.

FIG. 3 is a perspective view of a chip package in accordance with an embodiment of the present invention.

With reference to FIG. 3, the package 40 includes a chip 35 and two substrates, i.e., a first substrate 31a formed on the upper surface of the chip 35 and a second substrate 31b formed on the lower surface of the chip 35. The chip 35 includes a first terminal (not shown) formed on the upper surface and a second terminal (not shown) formed on the lower surface. The first terminal and the second terminal are generally opposite to each other. Herein, the first substrate 31a is attached to the upper surface of the chip 35 with the first terminal and the second substrate 31b is attached to the lower surface of the chip 35 with the second terminal.

A first conductive via hole 32a is formed on the first substrate 31a and a second conductive via hole 32b is formed on the second substrate 31b, respectively. The first and the second conductive via holes 32a, 32b are filled with a conductive material so as to electrically connect the upper surfaces of the first and the second via holes 32a, 32b to the lower surfaces of the first and the second via holes 32a, 32b. Herein, the first and the second conductive via holes 32a, 32b are formed on a designated area of the first and the second substrates 31a, 31b, corresponding to the terminals of the chip 35. Therefore, the terminals of the chip 35 are electrically connected to an external device through the first and the second conductive via holes 32a, 32b. The locations of the first and the second conductive via holes 32a, 32b are not limited, and will be further described in detail in FIG. 7.

A resin molding part 37 for protecting the chip 35 is formed between the first substrate 31a and the second substrate 31b. Herein, resin used as the resin molding part 37 is the same as that of the molding part of the conventional package.

The package 40 of this embodiment of the present invention does not need any wire requiring large area. Further, since it is unnecessary to form at least two via holes and at least two conductive lands on a single ceramic substrate, a area for spacing the conductive lands is not required, thereby achieving a small-sized package, which is almost as much as the size of the chip.

Figure 4:
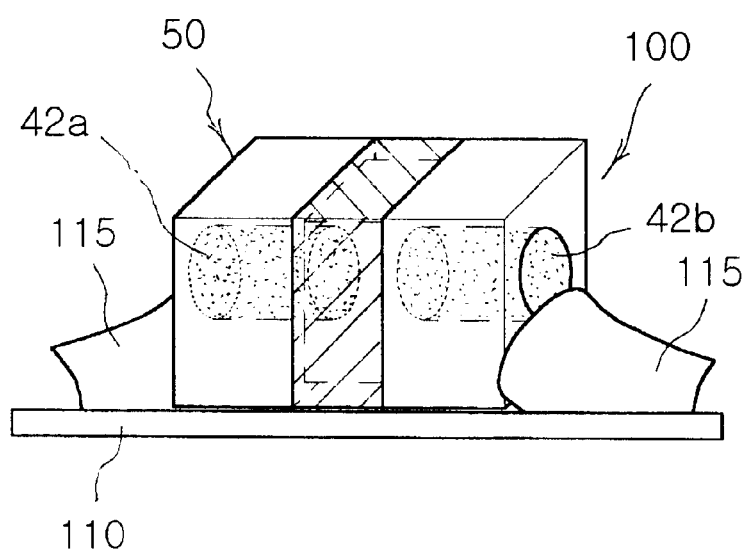
FIG. 4 is a schematic perspective view of a chip package array in accordance with an embodiment of the present invention.

These characteristics of the chip package of the present invention are more apparent by mounting the chip package on a printed circuit board. FIG. 4 is a schematic perspective view of a chip package array 100 in accordance with an embodiment of the present invention. The chip package 50 is mounted on a printed circuit board 110. Herein, the chip package assembly refers to an assembly including a chip package and the printed circuit board on which the chip package is mounted.

With reference to FIG. 4, the printed circuit board 110 includes signal patterns (not shown) formed on its upper surface. The signal patterns of the printed circuit board 110 include signal patterns to be connected to the terminals of the chip 35. The chip package 50 is vertically mounted on the printed circuit board 110 so that the outer surfaces of the first and the second substrates 41a, 41b attached to the upper and the lower surfaces of the chip 35 become side surfaces. That is, differing from the conventional mounting method, in which the upper and the lower surfaces of the chip package with terminals are horizontal to the printed circuit board, the chip package 50 of the present invention is turned at an angle of 90 degrees and this turned chip package 50 is then mounted on the printed circuit board 110. In this chip package 50 mounted on the printed circuit board 110, the first substrate 41a is opposite to the second substrate 41b. Therefore, the conductive via holes 42a, 42b formed on the first and the second substrates 41a, 41b are located on the side of the chip package assembly 100. Herein, solder parts 115 for connecting the signal patterns corresponding to each terminal to the first and the second conductive via holes 42a, 42b are formed on the printed circuit board 110. As shown in FIG. 3, since the first and the second conductive via holes 32a, 32b are connected to the corresponding terminals of the chip 35, the chip package 50 is electrically connected to the signal patterns of the printed circuit board 110.

In the chip package assembly of FIG. 4, in order to obtain a proper size of the chip package 50 being proper to the interval of the signal patterns, the size of the chip package 50 is changeable by adjusting the thickness of the first and the second substrates 41a, 41b attached to the upper and the lower surfaces of the chip package 50. Therefore, the chip package 50 of the present invention may be used without changing or modifying the signal patterns on the printed circuit board 110.

Figure 5:
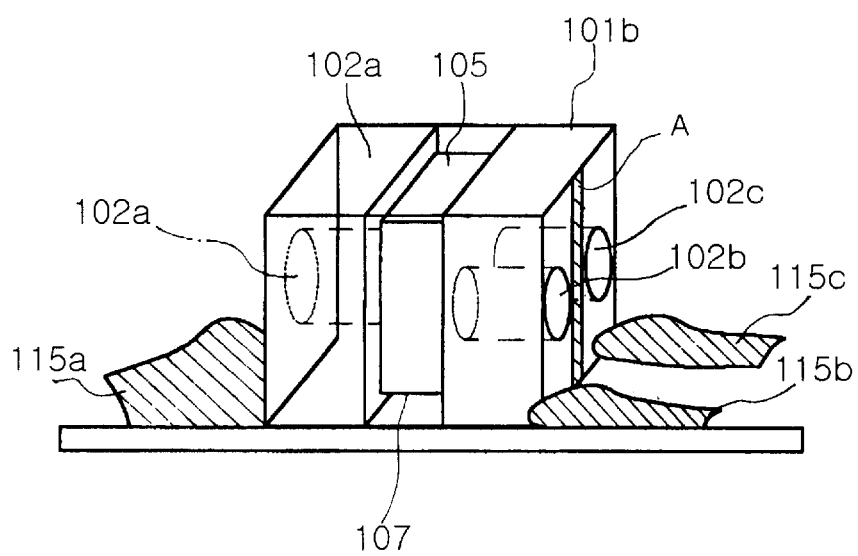
FIG. 5 is a schematic perspective view of a chip package array in accordance with another embodiment of the present invention.

FIG. 5 is a schematic perspective view of a chip package array in accordance with another embodiment of the present invention. The chip package array of this embodiment of the present invention is a transistor package array formed by packaging a transistor and mounting the packaged transistor 105 on a printed circuit board. One terminal is formed on the upper surface of the transistor 105 and two terminals are formed on the lower surface of the transistor 105. Therefore, one upper terminal of the upper surface of the transistor 105 is connected to the printed circuit board 91 by connecting a conductive via hole 102a of the first substrate 101a to a signal pattern of the printed circuit board 91 by a solder 115. On the other hand, since two lower terminals are formed on the lower surface of the transistor 105, an additional method of connecting two lower terminals to the printed circuit board 91 is required.

The lower surface of the transistor 105 with two lower terminals is attached to a second substrate 101b provided with two conductive via holes 102b, 102c for connecting the upper and the lower surfaces of the second substrate 101b. A conductive layer is formed on the upper and the lower surfaces of the second substrate 101b with two conductive via holes 102b, 102c. A non-conductive area A is formed on the upper and the lower surface of the second substrate 101b between the conductive via holes 102b, 102c, thereby connecting two lower terminals of the chip 105 to corresponding wiring circuits of the printed circuit board 91. Two conductive via holes 102b, 102c are connected to the wiring circuits of the printed circuit board 91 by the solder 115b, 115c through the conductive layer of the lower surface of the second substrate 101b.

FIGS. 6a to 6d are cross-sectional views illustrating a method of manufacturing the chip package of the present invention.

Figure 6A:
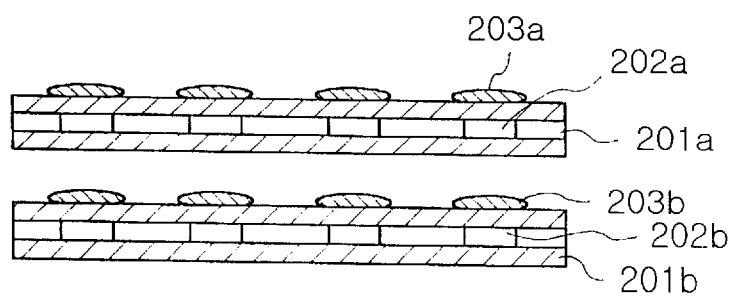
FIGS. 6a to 6d are cross-sectional views illustrating a method of manufacturing the chip package of the present invention.

As shown in FIG. 6a, the first substrate 201a and the second substrate 201b are prepared. A plurality of first conductive via holes 202a are formed on the first substrate 201a and spaced by a designated interval, and a plurality of second conductive via holes 202b are formed on the second substrate 201b and spaced by a designated interval. Preferably, a conductive adhesive is used as attaching means of the chip. Therefore, as shown in FIG. 6a, the conductive adhesives 203a, 203b are coated on the conductive via holes 202a, 202b. By using the conductive adhesives 203a, 203b, the terminals of the chip is mechanically fixed to the substrates as well as electrically connected to the conductive via holes of the substrates.

Figure 6B:
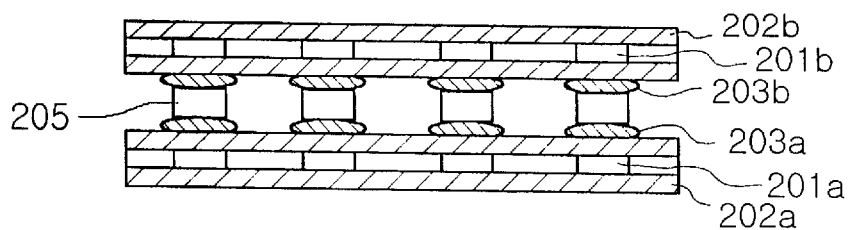

As shown in FIG. 6b, a plurality of the chips 205 are mounted on the upper surface of the second substrate 201b so that the lower terminals of the chips 205 are connected to the corresponding conductive via holes 202b of the second substrate 201b. Then, the first substrate 201a is mounted on the chips 205 so that the upper terminals of the chips 205 are connected to the corresponding conductive via holes 202a of the second substrate 201a. Herein, the chips 205 may be fixed to the first and the second substrates 201a, 201b by the aforementioned conductive adhesive 203 coated on the conductive via holes 202a, 202b, as shown in FIG. 6a.

Figure 6C:
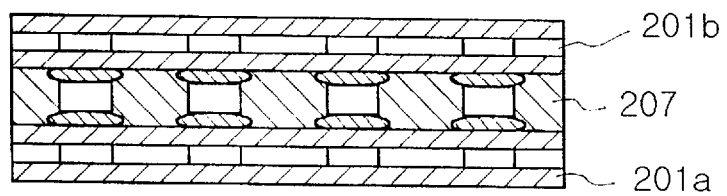

As shown in FIG. 6c, a space between the first substrate 201a and the second substrate 201b is filled with a resin, thereby forming a resin molding part 207. The resin molding part 207 serves to protect the chip 205.

Figure 6D:
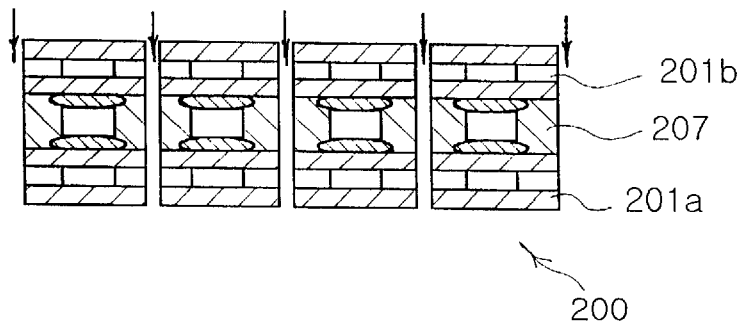

The manufactured assembly is sawed and cut into a plurality of the chip packages 200 as shown in FIG. 6d.

As described above, these chip packages 200 of the present invention may be easily manufactured using the substrates with the conductive via holes.

In the chip package of the present invention, the conductive via holes act to electrically connect the terminals of the chip to the signal patterns of the printed circuit board by the soldering. This conductive via hole is not limited to its shape.

Figure 7A:
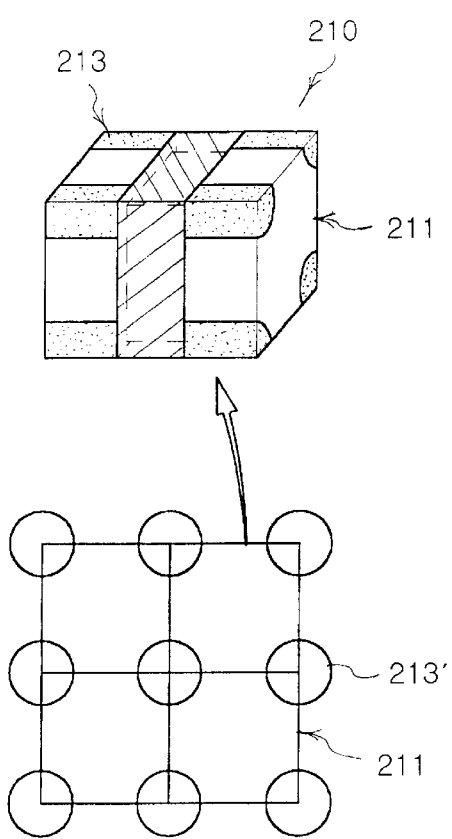
FIGS. 7a and 7b are schematic views, each illustrating a different shape of the via holes and the substrates using the via holes in accordance with yet another embodiment of the present invention.
Figure 7B:
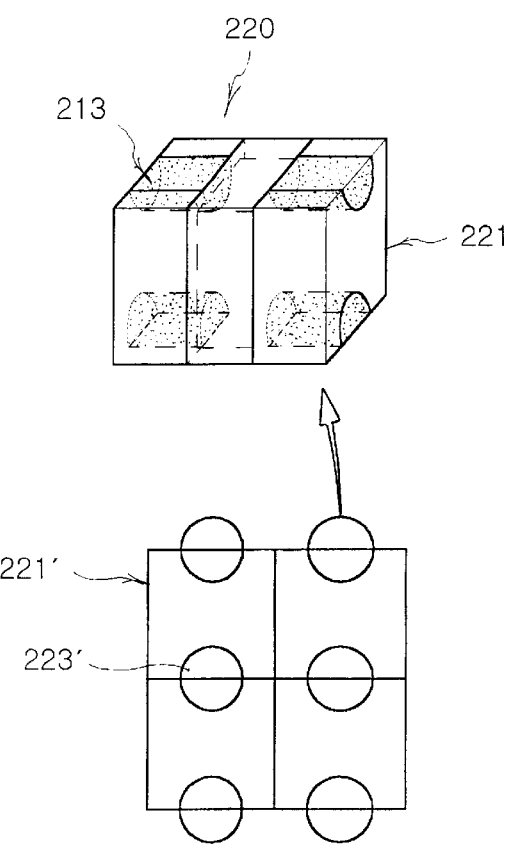

FIGS. 7a and 7b show various shapes of the via holes and the substrates using the via holes, which can be used on the chip packages 210, 220 of the present invention.

As shown in FIG. 7a, a conductive via hole 213 is formed at each corner of the substrate 211. These conductive via holes 213 are obtained by forming initial via holes 213' on a crossing area of scribe lines of an initial substrate 211', in forming the initial via hole 213' on the initial substrate 211'. After sawing and cutting the initial substrate 211' of FIG. 7a into a plurality of unit substrates 211, 4 quartered circular-shaped via holes 213 are formed at each corner of a single substrate 211. Two quartered circular-shaped via holes 213 may be formed at two corners of the same side of the substrate 211 and this side with two quartered circular-shaped conductive via holes 213 may be mounted on the printed circuit board.

As shown in FIG. 7b, a conductive via hole 223 is formed at two opposite sides of substrate 221. These conductive via holes 223 are obtained by forming initial via hole 223' on a central area of scribe lines of an initial substrate 221', in forming the initial via hole 223' on the initial substrate 221'. After sawing and cutting the initial substrate 221' of FIG. 7b into a plurality of unit substrate 221, 2 semicircular-shaped via holes 223 are formed at two opposite sides of a single substrate 221. One semicircular-shaped via hole 223 may be formed at a side of the substrate 221 and this side with a semicircular-shaped conductive via hole 223 may be mounted on the printed circuit board.

In case of using the conductive via holes of FIGS. 7a and 7b, when the manufactured chip package is turned at an angle of 90 degrees and the turned chip package is mounted on the printed circuit board, the conductive via holes can be more closed to the surface of the printed circuit board, thereby more easily connecting these conductive via holes of FIGS. 7a and 7b to the signal patterns of the printed circuit board by the soldering step.

As apparent from the above description, in accordance with the present invention, the chip package is more miniaturized and the manufacturing method of the chip package is more simplified by attaching a substrate provided with conductive via holes to two opposite surfaces of a chip and by forming a resin molding part in a space between two substrates. Further, the reliability of the chip package can be improved, thereby manufacturing a more stable package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A chip package comprising:
   a chip having a first surface provided with a first terminal and a second surface provided with at least one second terminal, the second surface being opposite to the first surface;
   a first substrate arranged on the first surface of said chip and having a first conductive via hole connected to the first terminal; and
   a second substrate arranged on the second surface of said chip and having at least one second conductive via hole connected to the second terminal.

2. The chip package as set forth in claim 1, further comprising a resin molding part formed around said chip between said first substrate and said second substrate.

3. The chip package as set forth in claim 1, wherein said first substrate has the same size and shape as those of said second substrate, and said resin molding part has the same size and shape as those of said first substrate and said second substrate.

4. The chip package as set forth in claim 1 having a hexahedral shape.

5. The chip package as set forth in claim 1, wherein said substrate is made of a printed circuit board.

6. The chip package as set forth in claim 1, wherein each of said first and second conductive via holes of said first and second substrates is formed on at least one side of each substrate in an approximately semicircular shape.

7. The chip package as set forth in claim 1, wherein each of said first and second conductive via holes of said first and second substrates is formed on at least one corner of each substrate in an approximately quartered-circular shape.

8. The chip package as set forth in claim 1, wherein said chip is a diode element, and wherein said second surface of the chip comprises one second terminal and said second substrate comprises one second conductive via hole.

9. The chip package as set forth in claim 1, wherein said chip is a transistor element, and wherein said second surface of the chip comprises two separate second terminals and said second substrate comprises two second conductive via holes.

10. A chip package assembly comprising:
    a chip package comprising:
    a chip having a first surface provided with a first terminal and a second surface provided with at least one second terminal, the second surface being opposite to the first surface;
    a first substrate arranged on the first surface of said chip and having a first conductive via hole connected to the first terminal; and
    a second substrate arranged on the second surface of said chip and having at least one second conductive via hole connected to the second terminal; and
    a printed circuit board comprising:
    a plurality of signal patterns formed on the upper surface of the printed circuit board and connected to said terminals of the chip package; and
    a plurality of conductors for connecting said first and second conductive via holes to said signal patterns,
    wherein said chip package is vertically mounted on the upper surface of said printed circuit board so that the outer surfaces of said first and second substrates become side surfaces.

11. The chip package assembly as set forth in claim 10, wherein the chip package further comprises a resin molding part formed around said chip between said first substrate and said second substrate.

12. The chip package assembly as set forth in claim 10, wherein said first substrate has the same size and shape as those of said second substrate, and said resin molding part has the same size and shape as those of said first substrate and said second substrate.

13. The chip package assembly as set forth in claim 10, wherein said chip package has a hexahedral shape.

14. The chip package assembly as set forth in claim 10, wherein said substrate is made of a printed circuit board.

15. The chip package assembly as set forth in claim 10, wherein each of said first and second conductive via holes of said first and second substrates is formed on at least one side of each substrate in an approximately semicircular shape.

16. The chip package assembly as set forth in claim 10, wherein each of said first and second conductive via holes of said first and second substrates is formed on at least one corner of each substrate in an approximately quarter-circular shape.

17. The chip package assembly as set forth in claim 10, wherein said chip is a diode element, and wherein said second surface of the chip comprises one second terminal and said second substrate comprises one second conductive via hole.

18. The chip package assembly as set forth in claim 9, wherein said chip is a transistor element, and wherein said second surface of the chip comprises two second terminals and said second substrate comprises two second conductive via holes.

* * * * *